United States Patent [19]
Schatz et al.

[11] Patent Number: 5,833,073
[45] Date of Patent: Nov. 10, 1998

[54] TACKY FILM FRAME FOR ELECTRONIC DEVICE

[75] Inventors: Steven L. Schatz, Bloomington; Robert J. Nentl, Lakeville, both of Minn.

[73] Assignee: Fluoroware, Inc., Chaska, Minn.

[21] Appl. No.: 867,184

[22] Filed: Jun. 2, 1997

[51] Int. Cl.⁶ .................................................. B65D 85/90
[52] U.S. Cl. .......................... 206/724; 206/460; 206/813
[58] Field of Search .................................... 206/460, 583, 206/701, 704, 706, 713, 714, 716, 722–725, 813

[56] References Cited

U.S. PATENT DOCUMENTS

| | | |
|---|---|---|
| 2,399,679 | 5/1946 | Jackson . |
| 2,885,849 | 5/1959 | Wohlman, Jr. . |
| 3,177,629 | 4/1965 | Anspach . |
| 3,608,711 | 9/1971 | Wiesler et al. . |
| 3,645,281 | 2/1972 | Seidler . |
| 3,691,436 | 9/1972 | Maijers et al. . |
| 3,695,414 | 10/1972 | Wiesler et al. . |
| 3,785,507 | 1/1974 | Wiesler et al. . |
| 3,858,721 | 1/1975 | Boyer et al. . |
| 3,881,245 | 5/1975 | Dudley et al. . |
| 3,970,494 | 7/1976 | Pritchard . |
| 3,971,193 | 7/1976 | Tardiff et al. . |
| 4,200,191 | 4/1980 | Nakamura et al. ..................... 206/722 |
| 4,298,120 | 11/1981 | Kaneko et al. . |
| 4,340,774 | 7/1982 | Nilsson et al. . |
| 4,522,679 | 6/1985 | Funakoshi et al. . |
| 4,562,924 | 1/1986 | Okamoto . |
| 4,575,995 | 3/1986 | Tabuchi et al. . |
| 4,631,103 | 12/1986 | Ametani . |
| 4,667,944 | 5/1987 | Althouse . |
| 4,702,788 | 10/1987 | Okui . |
| 4,711,014 | 12/1987 | Althouse . |
| 4,724,954 | 2/1988 | Sillner . |
| 4,732,642 | 3/1988 | Ametani . |
| 4,760,916 | 8/1988 | Kaneko et al. . |
| 4,775,438 | 10/1988 | Funakoshi et al. . |
| 4,778,326 | 10/1988 | Althouse et al. . |
| 4,820,369 | 4/1989 | Kubo . |
| 4,852,743 | 8/1989 | Ridgeway ............................... 206/521 |
| 4,865,677 | 9/1989 | Matsushita et al. . |
| 4,954,207 | 9/1990 | Higuchi et al. . |
| 4,966,281 | 10/1990 | Kawanishi et al. . |
| 4,966,282 | 10/1990 | Kawanishi et al. . |

(List continued on next page.)

FOREIGN PATENT DOCUMENTS

| | | |
|---|---|---|
| 2-127255 A | 5/1990 | Japan . |
| 7907599 | 10/1979 | Netherlands . |
| 2 083 000 | 3/1982 | United Kingdom . |

OTHER PUBLICATIONS

Fluoroware, Inc., "Chip Handling Products", ©1996.
Fluoroware, Inc., "Matrix Trays", ©1995.
Nitto Denk, "Nel System", ©1992.
Permacel, "Revalpha", ©1996.

*Primary Examiner*—Jimmy G. Foster
*Attorney, Agent, or Firm*—Palmatier, Sjoquist, Voigt & Christensen, P.A.

[57] ABSTRACT

A device for storing and transporting electronic devices such as semiconductor chips, comprising: a frame having a top side, a bottom side, a periphery, and a window within the periphery, a thin film covering the window, the thin film having on its top surface an adhesive layer, the adhesive layer being adapted to hold a plurality of electronic devices, the electronic devices being attachable to the adhesive layer at any location on the thin film within the window, and the electronic devices being uncovered, a recess in the bottom side, and a raised flange around the window on the top side wherein the raised flange of one of the devices mates with the recess of another device, thereby allowing the devices to be stacked. The adhesive properties of the adhesive layer may be greatly reduced by exposure to electromagnetic radiation such as heat (infrared) or ultraviolet, thereby releasing the electronic device.

30 Claims, 2 Drawing Sheets

U.S. PATENT DOCUMENTS

| | | |
|---|---|---|
| 4,979,611 | 12/1990 | Bolliger et al. . |
| 5,009,735 | 4/1991 | Ametani et al. . |
| 5,089,314 | 2/1992 | Masujima et al. . |
| 5,203,143 | 4/1993 | Gutentag . |
| 5,254,201 | 10/1993 | Konda et al. . |
| 5,304,418 | 4/1994 | Akada et al. . |
| 5,310,442 | 5/1994 | Ametani . |
| 5,426,558 | 6/1995 | Sherman . |
| 5,481,438 | 1/1996 | Nemoto ................................. 206/725 |
| 5,590,787 | 1/1997 | Hodges . |

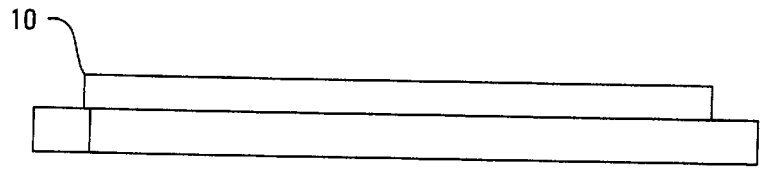
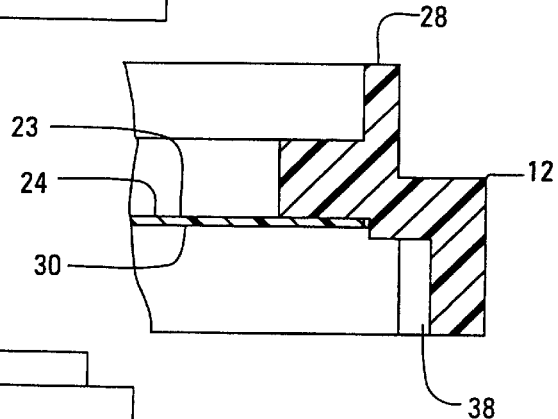
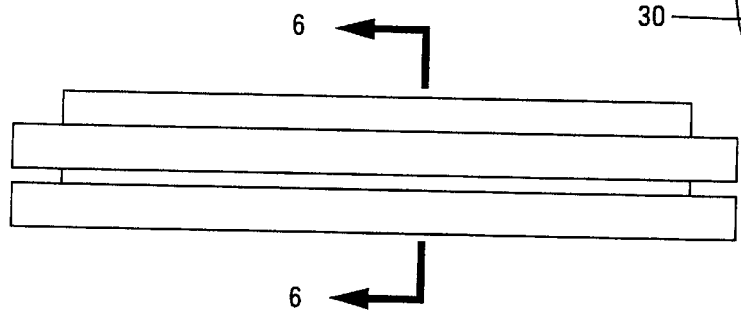
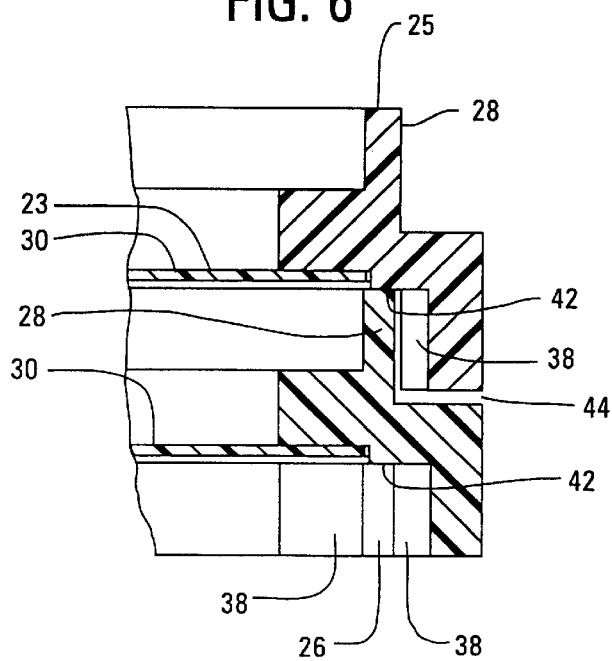
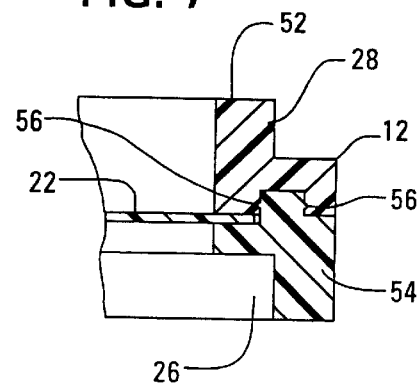

TACKY FILM FRAME FOR ELECTRONIC DEVICE

BACKGROUND OF THE INVENTION

This invention relates to a device for storing and transporting electronic devices, such as integrated circuit chips.

During the manufacture of printed circuit boards, it is necessary to access and manipulate a number of individual electronic devices, such as integrated circuits, for insertion on the printed circuit card.

Such electronic devices are tiny and easily become lost if not confined in an appropriate container. However, a storage and transportation container for such electronic devices must allow the devices to be easily accessed, especially by a robot. For best access, the storage and transportation container should not have a cover which would have to be removed by a robot arm. Additionally, the electronic devices must be held securely at defined locations within the storage container, in order to allow a robot arm to locate the devices for pickup. Finally, once the robot arm locates a device, the device should be removable from the storage container with a minimum of effort. There is a trade-off between the need to securely hold the electronic devices within the storage device in order to minimize particle-generating movement with the need for the electronic devices to be easily removed from the storage device.

In the past, carrier tapes have been used to hold and transport electronic devices, as is disclosed in U.S. Pat. No. 4,760,916 (Kaneko et al) and U.S. Pat. No. 4,966,282 (Kawanishi et al). In both of these patents, electronic devices are held within small cavities within the carrier tape by becoming adhered to an adhesive tape within the cavities. A major problem with such carrier tapes is that the cavities are of a fixed size and therefore a separate carrier tape must be manufactured for each different electronic device. Furthermore, the electronic devices can only be accessed sequentially, as the carrier tape is fed through a processing machine. Because of these two limitations, it is essentially impossible to use such carrier tapes to store and transport electronic devices of several different types which must all be simultaneously available to the robot arm. Moreover, the reels for holding such tape are bulky and typically of fixed sizes. Thus, whether 10 or 100 parts are to be furnished, the same size reel is likely to be used creating inefficiency in shipping and handling.

SUMMARY OF THE INVENTION

A device for storing and transporting electronic devices such as semiconductor chips, comprising: a frame having a top side, a bottom side, a periphery, and a window within the periphery, a thin film traversing the window, the thin film having on its top surface an adhesive layer, the adhesive layer being adapted to hold a plurality of electronic devices, the electronic devices being attachable to the adhesive layer at any location on the thin film within the window, and the electronic devices being uncovered, a recess in the bottom side, and a raised flange around the window on the top side wherein the raised flange of one of the devices mates with the recess of another device, thereby allowing the devices to be stacked. The adhesive properties of the adhesive layer may be sufficiently reduced by exposure to electromagnetic radiation such as heat (infrared) or ultraviolet, thereby releasing the electronic device.

A principal object and advantage of the present invention is that it provides a universal storage device for storing and transporting a number of electronic devices of different size and shape. A new storage device with a custom pocket size does not have to be created for each electronic device.

A second principal object and advantage of the present invention is that all of the electronic devices in the storage device are simultaneously accessible, as by a robot arm. This is as compared to previous carrier tapes, which only allow the electronic device to be sequentially accessed.

Another principal object and advantage of the present invention is that there is no cover which must be removed in order to access the electronic devices.

Another object and advantage of the present invention is that the electronic devices are held securely in place. This prevents particle-generating movement.

Another object-and advantage of the present invention is that the electronic devices are held precisely in place at defined locations within the storage device, so that automated device pick up by a robot arm may be carried out.

Another object and advantage of the present invention is that the storage devices are stackable on each other to minimize space requirements. Furthermore, as each device is stacked on the one below it, it provides a temporary cover for the electronic devices stored in the lower storage device.

Another object and advantage of the invention is that the thin membrane transversing the frames window allows heat, UV or other exterior influence to be easily accessible to the underside of the membrane directly opposite the component part.

BRIEF DESCRIPTION OF THE DRAWINGS

FIG. 3 is an elevational view of a single device.

FIG. 4 is an elevational view of two devices stacked.

FIG. 5 cross-section along the lines 5—5 of FIG. 1.

FIG. 6 is a cross-section showing two storage devices stacked.

FIG. 7 is a cross-sectional view of an alternate embodiment of the invention.

DETAILED DESCRIPTION OF THE PREFERRED EMBODIMENTS

Figure 1:
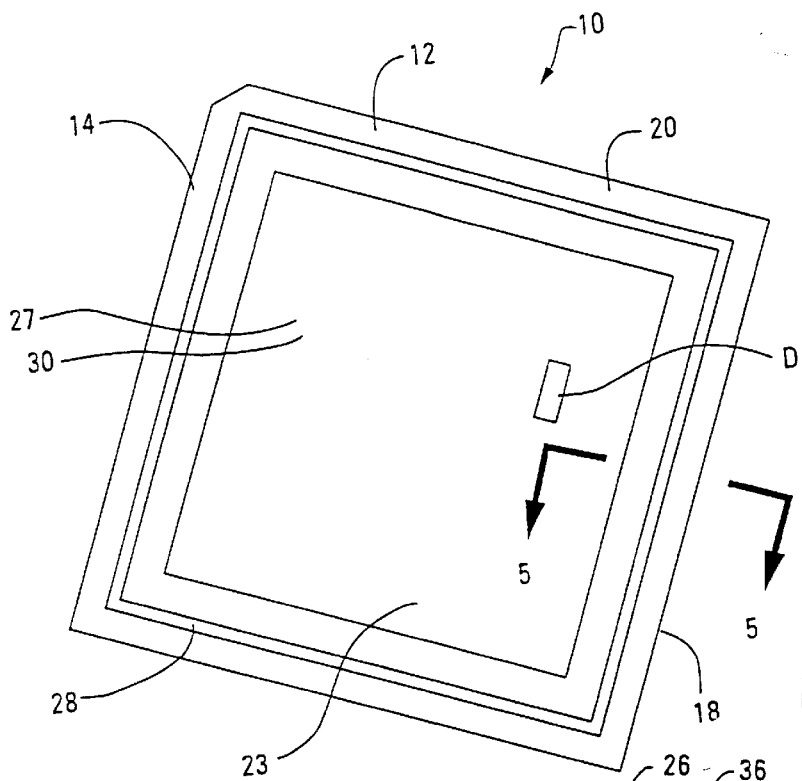
FIG. 1 is a top plan view of the storage device of the present invention.

The device of the present invention is generally shown in the Figures as reference numeral 10.

The device 10 consists of a frame 12 having a top side 14, a bottom side 16, a periphery 18, and a window 20 within the periphery 18.

A device supporting member 22 covers the window 18. The device supporting member 20 has a tacky side 23. The tacky side may be formed by an adhesive layer 24 on its top surface 14 or may be homogeneous.

The tacky side 23 and the adhesive layer 24 is adapted to hold a plurality of electronic devices D. The electronic devices D are generally attachable to the adhesive layer 24 at any location on the device supporting member 22 within the window 20.

As will be seen, the device 10 thus provides a universal storage device for storing and transporting a number of electronic devices D of different sizes and shapes. A new storage device with a custom pocket size does not have to be created for each electronic device D. The only limit on the size of the device D is the size of the window 20.

As can also be seen, there is typically no cover over the devices D. The devices D are thus easily accessible by a robot without removing a cover. A cover may introduce problems in the removal of the electronic devices D. For example, very small devices D may adhere to the cover when the cover is removed. Static electric charge buildups generated during cover tape peel back may cause the electronic devices D to stick to the cover. In addition, these static electric charges can damage or destroy active electronic components through electrostatic discharge.

As can also be seen, all of the electronic devices D in the storage device 10 are simultaneously accessible. It is not necessary to unwind a carrier tape to reach a particular electronic device D. This arrangement lends itself particularly well where the exact sequence in which different electronic devices are needed during assembly is not known, or varies between applications. A robot arm can access any of the electronic devices D in any desired sequence.

The electronic devices D are held securely in place on the adhesive layer 24, thus preventing particle-generating movement of the device D.

The electronic devices D may be held precisely in place at defined locations within the storage device 10, so that automated device pick up by a robot arm may be carried out. For example, a grid could be placed over the adhesive layer 24 with cells in which the devices D are placed.

The device 10 includes cooperating stacking structures to allow a plurality of the devices to be stacked in axial alignment. A first stacking structure 25 is configured as a raised flange 28 around the window 20 on the top side 14. A second stacking structure 27 is configured as a recess 26 in the bottom side 16. As can be seen in FIG. 4, the raised flange 28 of one of the storage devices 10 mates with the recess 26 of another storage device 10, thereby allowing the storage devices 10 to be stacked. This stacking capability minimizes the space requirements needed for the storage devices 10. Furthermore, as each device 10 is stacked on the device 10 below it, it provides a temporary cover for the electronic devices D stored in the lower storage device 10. The flange 28 and recess 26 combination effectively enclose and contain components on the supporting member 22. Other stacking structures such as nubs and cooperating indentations may also be used.

Figure 2:
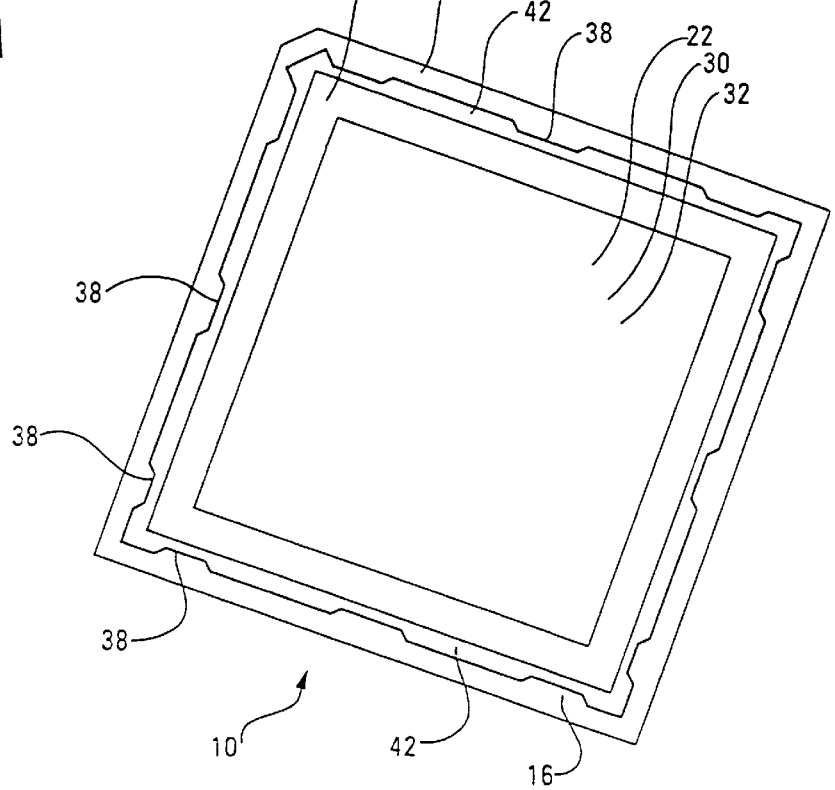
FIG. 2 is a bottom plan view of the storage device of the present invention.

Referring to FIGS. 2, 5 and 6, the recess 26 is defined by peripheral flange 36 with insets 38 and a shelf 42. When stacked, as shown in FIGS. 1 and 2, the top side 14, with the flange 28 and particularly the top surface 44 of the flange, engage and seat within the insets 38 on the shelf 42.

In one embodiment, the device support element 20 may be a thin, flexible film or membrane 30. The film may preferably me made of a transparent, tear proof, puncture proof plastic as is disclosed in U.S. Pat. No. 4,979,611, herein incorporated by reference. Preferably, the film is comprised of plastics selected from the group consisting of polyesters, ethylene-vinyl acetate copolymers, polyvinyl chloride, and polyolefins. Preferably, the thickness of the film is in the range of 70 microns to 150 microns. Such films are described in the ELEP holders manufactured by Nitto Denko Corporation, Tokyo, Japan. The flexibility of the film or membrane 30 provides a cushioning effect for the electronic devices; inasmuch as the window 20 is otherwise open without any sort of solid support.

Preferably, the thin film 30 is attached to the recess 26 around the edges of the window 20. The film and frame may be static dissipative to minimize the chance of damage from static discharges.

Alternatively, as shown in FIG. 7 each frame 12 may be formed of an upper portion 52 and a lower portion 54 secured together with the device supporting member 22 pinched in between the upper and lower portions. The upper and lower portions may be secured together such as by detents 56 or other suitable means such as adhesives, welding or mechanical fasteners.

In a preferred embodiment, the adhesive layer 24 is washable. Thus, any dirt or other contaminants may be easily removed from the adhesive layer 24 without any loss of adhesive strength. The adhesive layer 24 is preferably an acrylic base adhesive or a silicone base adhesive. Such a washable adhesive layer is described in U.S. Pat. No. 3,645,281, herein incorporated by reference.

In the preferred embodiment, the storage device 10 has a substantially square shape. The device in one convenient configuration measures 2 inches to 4 inches per side.

The adhesive properties of the adhesive layer 24 may be such that the tackiness or adhesive characteristic is sufficiently reduced by exposure to electromagnetic radiation such as heat (infrared) or ultraviolet, thereby providing easy release of the electronic device. An example of such an adhesive is in the Revalpha Thermal Release Sheet manufactured by Permacel, P.O. Box 671, U.S. Route 1 South, New Brunswick, N.J. 08903-0671. Tape with such characteristics is also available from the Nitto Denko America, Inc., 55 Nicholson Lane, San Jose, Calif. 95134, and Wadsworth-Pacific Manufacturing Assoc., Palo Alto, Calif.

The frame may be injection molded and is preferably formed of plastics such as polycarbonate, polypropylene, acrylonitrile butadiene styrene (ABS), or polyetheretherketone (PEEK) and may have added carbon filler for providing static dissipative characteristics.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed:

1. A device for storing and transporting electronic devices such as semiconductor chips, comprising:
 a frame having a top side, a bottom side, a periphery, and a window within the periphery,
 a device supporting member traversing the window,
 the device supporting member having a tacky side, the tacky side being adapted to hold an electronic device, the electronic device being adherable to the tacky side within the window,
 the top side having a first stacking structure, and the bottom side having a second stacking structure, one of said first and second stacking structures projecting outwardly from the frame, the other of said stacking structures configured to cooperatively engage and receive with the stacking structure projecting outwardly such that stacking of the devices is facilitated.

2. The device of claim 1, wherein the first stacking structure is a raised flange portion, and the second stacking structure defines a recess sized to cooperate with said first stacking structure.

3. The device of claim 2, wherein the device supporting member is a thin, flexible film.

4. The device of claim 3, wherein the film is attached to the recess around the edges of the window.

5. The device of claim 1, wherein the tacky side is washable.

6. The device of claim 3, wherein the film is comprised of plastic selected from the group consisting of polyesters, ethylene-vinyl acetate copolymers, polyvinyl chloride, and polyolefins.

7. The device of claim 3, wherein the thickness of the film is in the range of 70 microns to 150 microns.

8. The device of claim 1, wherein the device supporting member is a thin film with an adhesive layer forming the tacky side.

9. The device of claim 1, wherein the frame has a substantially square shape.

10. The device of claim 1, wherein the film and frame are both comprised of static dissipative material.

11. The device of claim 1, wherein the adhesive properties of the adhesive are greatly reduced by exposure to electromagnetic radiation, thereby releasing the electronic device from the adhesive.

12. The device of claim 1, wherein the electromagnetic radiation is heat.

13. The device of claim 1, wherein the electromagnetic radiation is ultraviolet.

14. A device for storing and transporting electronic devices such as semiconductor chips, comprising:
   a frame having a top side, a bottom side, a periphery, and a window within the periphery,
   a thin, flexible film with two surfaces covering the window,
   the thin, flexible film having on one surface an adhesive layer, the adhesive layer being adapted to hold a plurality of electronic devices, the electronic devices being attachable to the adhesive layer at a plurality of locations within the window,
   a recess in the bottom side, and
   a raised flange around the window on the top side
   wherein the raised flange of one of the devices mates with the recess of another device, thereby allowing the devices to be stacked.

15. The device of claim 14, wherein the film is attached to the recess around the edges of the window.

16. The device of claim 14, wherein the adhesive layer is washable.

17. The device of claim 14, wherein the film is comprised of plastics selected from the group consisting of polyesters, ethylene-vinyl acetate copolymers, polyvinyl chloride, and polyolefins.

18. The device of claim 14, wherein the thickness of the film is in the range of 70 microns to 150 microns.

19. The device of claim 14, wherein the adhesive properties of the adhesive layer are greatly reduced by exposure to electromagnetic radiation, thereby releasing the electronic device from the adhesive.

20. The device of claim 19, wherein the electromagnetic radiation is heat.

21. The device of claim 19, wherein the electromagnetic radiation is ultraviolet.

22. A device for storing and transporting electronic devices such as semiconductor chips, comprising:
   a frame having a top side, a bottom side, a periphery, and a window within the periphery,
   a thin, flexible film covering the window,
   the thin, flexible film having on one surface a washable adhesive layer, the adhesive layer being adapted to hold a plurality of electronic devices, the electronic devices being attachable to the adhesive layer at any location on the thin film within the window, and the electronic devices being uncovered,
   a recess in the bottom side, and
   a raised flange around the window on the top side
   wherein the thin film is attached to the recess around the edges of the window and wherein the raised flange of one of the devices mates with the recess of another device, thereby allowing the devices to be stacked.

23. The device of claim 22, wherein the film is comprised of plastics selected from the group consisting of polyesters, ethylene-vinyl acetate copolymers, polyvinyl chloride, and polyolefins.

24. The device of claim 22, wherein the thickness of the film is in the range of 70 microns to 150 microns.

25. The device of claim 22, wherein the adhesive properties of the adhesive are greatly reduced by exposure to electromagnetic radiation, thereby releasing the electronic device from the adhesive.

26. The device of claim 25, wherein the electromagnetic radiation is heat.

27. The device of claim 25, wherein the electromagnetic radiation is ultraviolet.

28. A device for storing and transporting electronic devices such as semiconductor chips, comprising:
   a frame having a top side, a bottom side, a periphery, and an open window within the periphery, one of said top side and bottom side having an outwardly extending flange, and the other of said top side and bottom side having a recess sized to said flange whereby a plurality of such devices may be stacked,
   a membrane covering the open window,
   the membrane having on its top surface an adhesive layer, the adhesive layer being adapted to hold a plurality of electronic devices, the electronic devices being attachable to the adhesive layer at any location on the membrane within the window, and the electronic devices being uncovered,
   wherein the adhesive properties of the adhesive layer are greatly reduced by exposure to electromagnetic radiation, thereby releasing the electronic device.

29. The device of claim 28, wherein the electromagnetic radiation is heat.

30. The device of claim 28, wherein the electromagnetic radiation is ultraviolet.

\* \* \* \* \*